(12) United States Patent
Kim et al.

(10) Patent No.: US 10,622,313 B2
(45) Date of Patent: Apr. 14, 2020

(54) SHIELDED ELECTRONIC DEVICE MODULE AND METHOD OF MEASURING SHIELDING THEREOF

(71) Applicant: SAMSUNG ELECTRO-MECHANICS CO., LTD., Suwon-si (KR)

(72) Inventors: Thomas A Kim, Suwon-si (KR); Chang Moo Jung, Suwon-si (KR); Kyung In Kang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 221 days.

(21) Appl. No.: 15/286,614

(22) Filed: Oct. 6, 2016

(65) Prior Publication Data
US 2017/0265339 A1    Sep. 14, 2017

(30) Foreign Application Priority Data
Mar. 8, 2016  (KR) .......................... 10-2016-0027473

(51) Int. Cl.
*H01L 23/552*  (2006.01)
*G01R 1/04*  (2006.01)
*H01L 23/498*  (2006.01)

(52) U.S. Cl.
CPC .............. *H01L 23/552* (2013.01); *G01R 1/04* (2013.01); *H01L 23/49805* (2013.01); *H01L 23/49838* (2013.01); *H01L 2924/15311* (2013.01); *H01L 2924/3025* (2013.01)

(58) Field of Classification Search
CPC ... G01R 31/00; G01R 31/44; H01L 23/49838; H01L 23/552
See application file for complete search history.

(56) References Cited

U.S. PATENT DOCUMENTS

| | | | |
|---|---|---|---|
| 6,288,910 B1 * | 9/2001 | Saito | H05K 9/0024 361/799 |
| 2012/0168214 A1 * | 7/2012 | Kashiwagi | H01L 23/3121 174/257 |
| 2012/0223697 A1 | 9/2012 | Lee et al. | |

(Continued)

FOREIGN PATENT DOCUMENTS

| KR | 10-2007-0080783 A | 8/2007 |
|---|---|---|
| KR | 10-2011-0024791 A | 3/2011 |

(Continued)

OTHER PUBLICATIONS

Korean Office Action dated Jan. 18, 2017, in counterpart Korean Application No. 10-2016-0027473 (12 pages in English, 8 pages in Korean).

*Primary Examiner* — Daniel P Wicklund
*Assistant Examiner* — Christopher L Augustin
(74) *Attorney, Agent, or Firm* — NSIP Law

(57) ABSTRACT

A shielded electronic device module includes a substrate that includes a first conductive member and a second conductive member separated from each other, a metal housing covering a mounting space on the substrate and connected to the first conductive member and the second conductive member, and a first terminal and a second terminal disposed on a surface of the substrate and connected to the first conductive member and the second conductive member.

23 Claims, 7 Drawing Sheets

(56) References Cited

U.S. PATENT DOCUMENTS

| | | | |
|---|---|---|---|
| 2013/0020119 A1* | 1/2013 | Yoshida | H05K 1/0218 |
| | | | 174/260 |
| 2015/0129874 A1 | 5/2015 | Choi et al. | |
| 2016/0276288 A1* | 9/2016 | Lee | H01L 23/552 |
| 2017/0025361 A1* | 1/2017 | Lee | H01L 21/561 |
| 2017/0062352 A1* | 3/2017 | Choi | H01L 23/552 |
| 2017/0110412 A1* | 4/2017 | Wang | H01L 21/78 |
| 2017/0179039 A1* | 6/2017 | Lee | H01L 23/552 |
| 2017/0186698 A1* | 6/2017 | Dimayuga | H01L 24/97 |
| 2017/0186699 A1* | 6/2017 | Li | H01L 23/552 |
| 2017/0200682 A1* | 7/2017 | Lin | H05K 999/99 |
| 2017/0221859 A1* | 8/2017 | Chen | H01L 21/78 |
| 2018/0068914 A1* | 3/2018 | Duanmu | H01L 23/10 |

FOREIGN PATENT DOCUMENTS

| | | |
|---|---|---|
| KR | 10-2011-0133820 A | 12/2011 |
| KR | 10-2015-0055987 A | 5/2015 |

\* cited by examiner

SHIELDED ELECTRONIC DEVICE MODULE AND METHOD OF MEASURING SHIELDING THEREOF

CROSS-REFERENCE TO RELATED APPLICATION

This application claims the benefit under 35 USC 119(a) of Korean Patent Application No. 10-2016-0027473 filed on Mar. 8, 2016 in the Korean Intellectual Property Office, the entire disclosure of which is incorporated herein by reference for all purposes.

BACKGROUND

Field

The following description relates to a shielded electronic device module and a method of measuring shielding thereof.

Description of Related Art

Generally, electronic device modules may be packaged with an electromagnetic shield to mitigate electromagnetic interference. Such package types are then required to pass a shielding measurement and validation process.

As integrated circuit (IC) and IC packaging technology improves, shielded electronic device modules have become highly-integrated, miniaturized, and thinned complicating the task of shielding measurement and validation. For example, an electronic device module with shielded packaging may be damaged during the shielding measurement and validation process.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a shielded electronic device module includes a substrate including a first conductive member and a second conductive member separated from each other, a metal housing covering a mounting space on the substrate, and connected to the first conductive member and the second conductive member; and a first terminal and a second terminal disposed on a surface of the substrate and connected to the first conductive member and the second conductive member.

The first conductive member and the second conductive member may be exposed to another surface of the substrate, and the metal housing may be contact with the first conductive member and the second conductive member on the other surface of the substrate.

The shielded electronic device module of may further include an electronic device disposed on the mounting space on the substrate, and the first conductive member may provide a ground voltage for the electronic device.

The shielded electronic device module of may further include third terminals disposed on the surface of the substrate, and one portion of the third terminals may provide a ground voltage for the electronic device, and another portion of the third terminals may provide a signal path for the electronic device.

The substrate may include an insulating member disposed between the first conductive member and the second conductive member.

The substrate may include layers stacked on each other, the first conductive member and the second conductive member may be disposed together on one of the layers, and the insulating member may surround the first conductive member and the second conductive member.

The substrate may include third to fifth conductive members separated from the first conductive member and the second conductive member, and separated from each other, and the third to fifth conductive members may be connected to the metal housing.

The second to fifth conductive members may be disposed closer to corners of the metal housing than to the first conductive member.

The second to fifth conductive members may have a same form, and may have a different form from that of the first conductive member.

The second to fifth conductive members may be smaller than the first conductive member.

The contact points, between the second to fifth conductive members and the metal housing, may be configured so that each contact point is equidistant from two other contact points.

The electrical connection between the second conductor and the metal housing may include a small area to increase the resistance between the second conductor and the metal housing.

The surface of the substrate may be external to the shielded electronic device module.

In another general aspect, a method of measuring shielding of a shielded electronic device module includes contacting a first measuring terminal with a region on a second surface of a substrate in which a first surface is shielded, contacting a second measuring terminal in a region other than the region on the second surface, and measuring a voltage and/or a current between the first measuring terminal and the second measuring terminal.

The contacting of the first measuring terminal may include the first measuring terminal being contact with a first pad disposed on the second surface, the contacting of the second measuring terminal may include the second measuring terminal being contact with a second pad disposed on the second surface, and the first pad and the second pad may be separated from each other.

In another general aspect, a shielded electronic device module includes a mounting surface of a substrate shielded by a metal housing, a first planar conductor disposed within the substrate, configured to shield the mounting surface of the substrate, and connected to the metal housing, a second conductor connected to a portion of the metal housing and a third conductor connected to a different portion of the metal housing, where the first conductor, the second conductor, and the third conductor are connected to isolated terminals on an external surface of the shielded electronic device module.

The first planar conductor may be connected to a ground terminal.

The shielded electronic device module may include a fourth conductor configured to provide a signal path between the mounting surface of the substrate and a signal terminal on the external surface of the shielded electronic device module.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
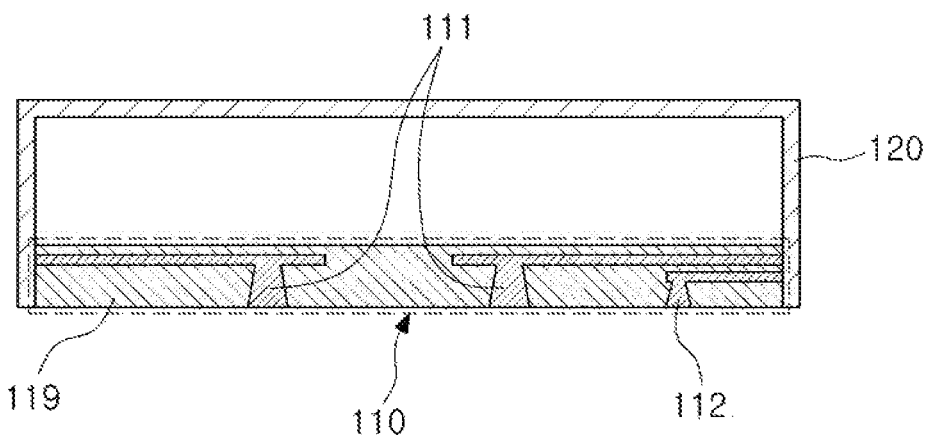
FIG. 1 is a view illustrating a shielded electronic device module, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent to one of ordinary skill in the art. Further, although the examples described herein have a variety of configurations, other configurations are possible as will be apparent to one of ordinary skill in the art.

FIG. 1 is a view illustrating a shielded electronic device module, according to an embodiment.

With reference to FIG. 1, the shielded electronic device module comprises a substrate 110 and a metal housing 120.

The substrate 110 comprises a first conductive member 111, a second conductive member 112, and an insulating member 119.

The substrate 110 is formed such that at least one insulating member, 119, and at least one conductive member, 111 or 112, are stacked. The substrate 110 may be, for example, one of a ceramic substrate, a printed circuit board, and a flexible substrate, but is not limited thereto.

The metal housing 120 is shown covering a surface the substrate 110 in FIG. 1. Thus, the surface of the substrate 110 may be protected from an external physical or electrical shock.

In addition, at least a portion of the metal housing 120 may be formed using metal. For example, the metal housing 120 may have a form in which a metallic cap is covered with plastic, an inner surface or an outer surface of the metal housing may have a form plated with metal, and the entirety of the metal housing may be formed of metal.

Thus, the surface of the substrate 110 is shielded from electromagnetic waves generated outside the metal housing 120. Furthermore, electromagnetic waves generated inside the metal housing 120 are prevented from being emitted outside the metal housing 120. Additionally, heat generated inside the metal housing 120 may be efficiently dispersed. The performance of the shielding may be varied according to a distribution of metal forming the metal housing 120, which may be measured by measuring the conductivity of the metal housing 120.

As seen in FIG. 1, the metal housing 120 is electrically connected to the first conductive member 111 and the second conductive member 112. For example, when the first conductive member 111 and the second conductive member 112 are exposed to a lateral surface of the substrate 110, the metal housing 120 is in contact with the lateral surface of the substrate 110 such that the metal housing 120 is electrically connected to the first conductive member 111 and the second conductive member 112.

When at least one of the first conductive member 111 and the second conductive member 112 provides a ground voltage, the metal housing 120 provides improved electromagnetic shielding dependent upon the conductivity of the metal housing 120 and the conductivity of one of the first conductive member 111 and the second conductive member 112. The electrical conductivity of the metal housing 120 and at least one of the first conductive member 111 and the second conductive member 112 is determined by measuring the conductivity between the first conductive member 111 and the second conductive member 112, which are electrically connected through the metal housing 120.

In accordance with an embodiment, the conductivity of the metal housing 120 is measured through the first conductive member 111 and the second conductive member 112. For example, the conductivity of the metal housing 120 is measured by applying a certain voltage to each of a first measuring terminal and a second measuring terminal, where the first measuring terminal and the second measuring terminal are in contact with each of the first conductive member 111 and the second conductive member 112, respectively.

The first conductive member 111 and the second conductive member 112 are included in the substrate 110. Therefore, the first measuring terminal and the second measuring terminal contact the substrate 110 instead of being in direct contact with the metal housing 120. Thus, damage to the metal housing 120, caused by direct contact between the metal housing 120 and the measuring terminal, may be thereby prevented. In addition, measurement errors caused by contact points between the measuring terminals and the metal housing 120 are avoided, which increases the accuracy of the conductivity measurement of the metal housing 120. It should be appreciated that the contact between the substrate 110 and the first and second measuring terminals may be an electrical connection through intermediating layers, conductors, passive elements or active elements.

In addition, when one of the first conductive member 111 and the second conductive member 112 provides a ground voltage, the other thereof is provided to efficiently and accurately measure the conductivity the metal housing 120. For example, when the first conductive member 111 provides a ground voltage, the second conductive member 112 is configured to have a resistance suitable to conduct measurement of the metal housing 120. Thus, the degree of accuracy of conductivity measurement of the metal housing 120 is improved. Furthermore, additional measuring terminals may conduct testing of other elements simultaneously with the conductivity measurement of the metal housing 120. Thus, the efficiency of the testing of the substrate package may be improved. As a further example, multiple shielded electronic device modules may be efficiently tested simultaneously.

Figure 2:
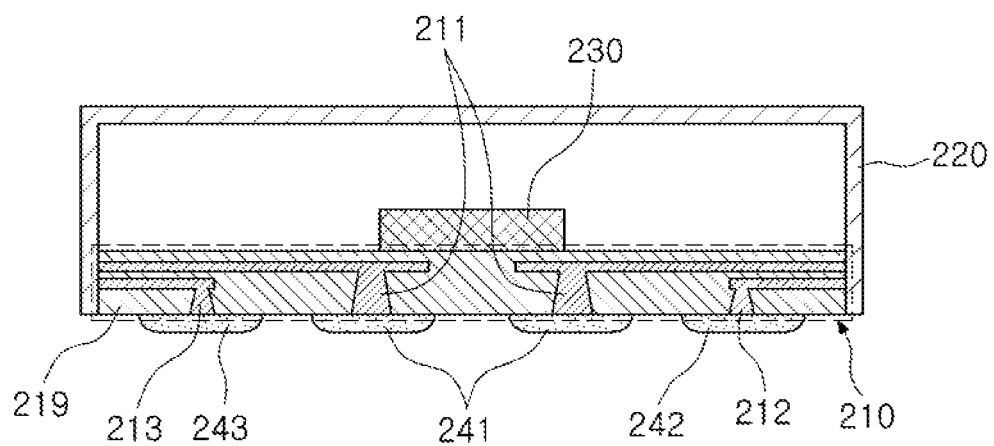
FIG. 2 is a view illustrating a shielded electronic device module, according to an embodiment.

FIG. 2 is a view illustrating a shielded electronic device module, according to an embodiment.

With reference to FIG. 2, a shielded electronic device module, according to an embodiment, includes a substrate 210, a metal housing 220, an electronic device 230, a first terminal 241, a second terminal 242, and a third terminal 243.

The substrate 210 includes first, second, and third conductive members 211, 212, and 213, and an insulating member 219. Each of the conductive members, 211, 212, and 213 are electrically connected to different locations of the metal housing 220.

For example, in the metal housing 220, a surface to which the second conductive member 212 is connected and a surface to which the third conductive member 213 is connected are different from each other. Thus, the third conductive member 213 provides an additional path between the substrate 210 and the metal housing 220. The additional path will be described later with respect to FIGS. 3 and 4.

The electronic device 230 is disposed on one surface of the substrate 210 and enclosed by the metal housing 220. For example, the electronic device 230 performs operations such as processing of a wireless communications signal or power by receiving a voltage and a signal through additional terminals and conductive members, as seen, for example, in FIGS. 6 and 7.

Electromagnetic waves and heat may be generated during operation of the electronic device 230. The electromagnetic waves are shielded by the metal housing 220, and at least one of the terminals 241, 242, and 243 is grounded during operation. As a result, the heat may be efficiently dispersed by an improved thermal conductivity of the metal housing 220.

The first, second, and third terminals 241, 242, and 243 are disposed in a bottom surface of the substrate 210 to be electrically connected to the first, second, and third conductive members 211, 212, and 213, respectively. Each of the first, second, and third terminals 241, 242, and 243 may be provided as a pad and/or a pin.

The pad protects the electronic device 230 from falling, thermal shock, or breakage, and the pad may not be electrically connected to the electronic device 230. Thus, a terminal electrically connected to a conductive member providing a ground voltage may be provided in the form of a pin, and a terminal electrically connected to a conductive member designed for conductivity measurement of a metal housing may be provided in the form of a pad.

Figure 3:
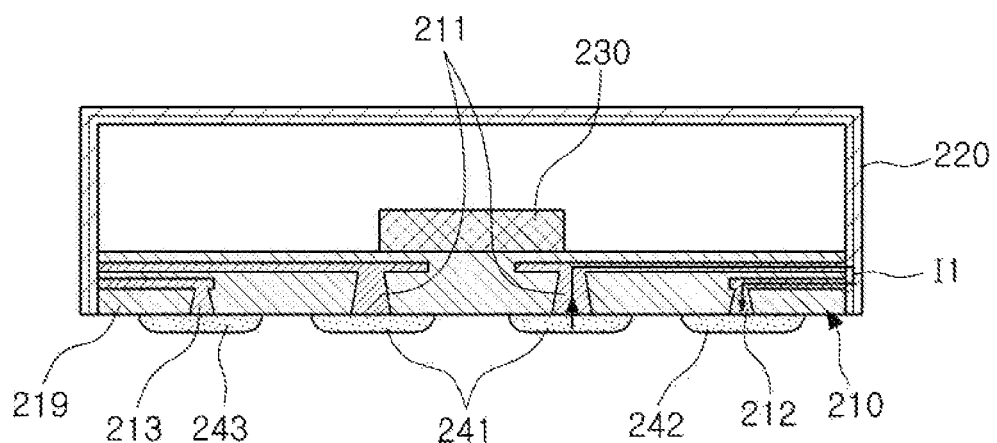
FIG. 3 is a view illustrating current flows when shielding of a shielded electronic device module is measured, according to an embodiment.

FIG. 3 is a view illustrating current flows when shielding of a shielded electronic device module is measured, according to an embodiment.

With reference to FIG. 3, the shielded electronic device module is shown to measure shielding of the metal housing 220 through a current I1 flowing in the first terminal 241, the first conductive member 211, the metal housing 220, the second conductive member 212, and the second terminal 242 in sequence. While the current is illustrated flowing in a single direction, the direction is shown for exemplary purposes and may be reversed or oscillated without departing from the spirit of the present disclosure.

Thus, conductivity of the metal housing 220 and a terminal resistance of a conductive member of the metal housing is measured by determining the voltage difference and the magnitude of the current between the first terminal 241 and the second terminal 242.

Figure 4:
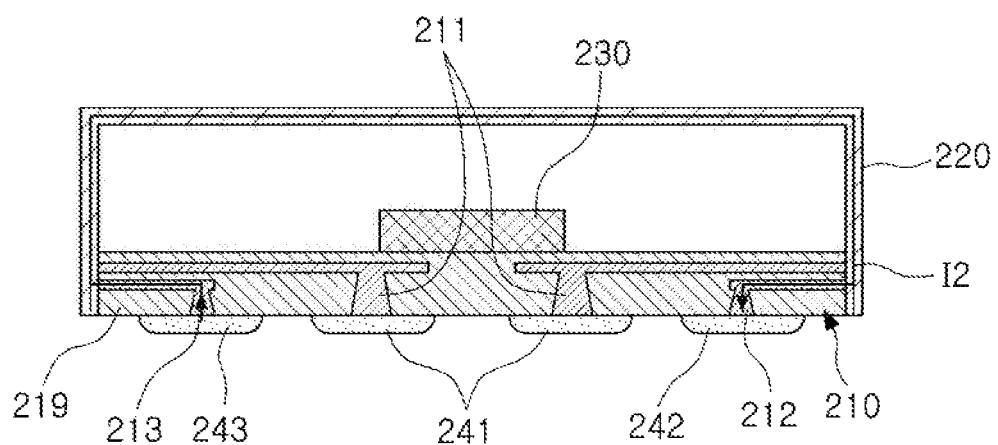
FIG. 4 is a view illustrating current flows when shielding of a shielded electronic device module is measured, according to an embodiment.

FIG. 4 is a view illustrating current flows when shielding of a shielded electronic device module is measured, according to an embodiment.

With reference to FIG. 4, the shielded electronic device module is measured based on the conductivity of the metal housing 220. The conductivity of the metal housing 220 is determined using a current I2 flowing in the third terminal 243, the third conductive member 213, the metal housing 220, the second conductive member 212, and the second terminal 242 in sequence. While the current is shown flowing in a single direction, the direction is shown for exemplary purposes and may be reversed or oscillated without departing from the spirit of the present disclosure.

Through comparison of the current I1 illustrated in FIG. 3 and the current I2 illustrated in FIG. 4, the conductivity of the metal housing 220 and the terminal resistance with respect to the conductive members 211, 212, and 213 may be distinguished from each other.

Figure 5:
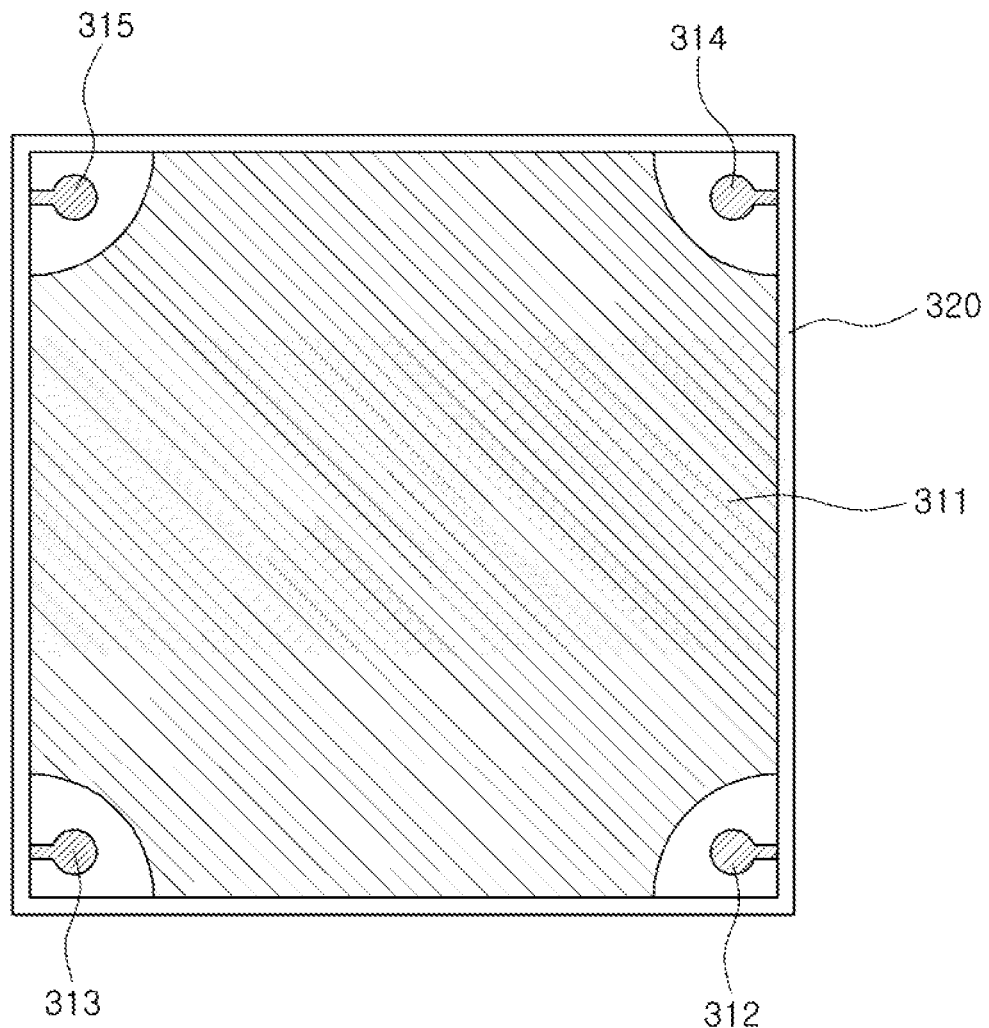
FIG. 5 is a view illustrating conductive members included in a shielded electronic device module, according to an embodiment.

FIG. 5 is a view illustrating conductive members included in a shielded electronic device module, according to an embodiment.

With reference to FIG. 5, the conductive members include a first conductive member 311, a second conductive member 312, a third conductive member 313, a fourth conductive member 314, and a fifth conductive member 315.

The first conductive member 311 may have a form of an octagon in which at least one region is penetrated. A position of the at least one penetrated region may be a vertex of the octagon.

The second conductive member 312, the third conductive member 313, the fourth conductive member 314, and the fifth conductive member 315 may be separated from the first conductive member 311, disposed in the at least one region, and may have a form, shape, configuration, or composition different from that of the first conductive member 311.

For example, the second conductive member 312, the third conductive member 313, the fourth conductive member 314, and the fifth conductive member 315 may have a same form. Thus, a degree of freedom of selection of a conductive member used when conductivity of a metal housing 320 is measured, is improved.

For example, the second conductive member 312, the third conductive member 313, the fourth conductive member 314, and the fifth conductive member 315 are configured or produced to have a small area in contact with the metal housing 320. Thus, the electrical resistance between each of the second conductive member 312, the third conductive member 313, the fourth conductive member 314, and the fifth conductive member 315, and the metal housing 320, is increased. Thus, the degree of accuracy of conductivity measurement with respect to the metal housing 320 is increased.

For example, the second conductive member 312, the third conductive member 313, the fourth conductive member 314, and the fifth conductive member 315 are disposed such that their electrical contact points to the metal housing 320 are at specific distances to each other. In another example, the specific distances are in accordance with Equation 1 below. Where a distance between a connection contact point of the second conductive member 312 and a connection contact point of the third conductive member 313 in the metal housing is d1, a distance between a connection contact point of the third conductive member 313 and a connection contact point of the fifth conductive member 315 in the metal housing is d2, a distance between a connection contact point of the fifth conductive member 315 and a connection contact point of the fourth conductive member 314 in the metal housing is d3, and a distance between a connection contact point of the fifth fourth conductive member 314 and a connection contact point of the second conductive member 312 in the metal housing is d4.

$$d1=d2=d3=d4 \quad \text{[Equation 1]}$$

Thus, when multiple conductive members 312, 313, 314, and 315 are provided, a degree of freedom of selection of a conductive member used when the conductivity of the metal housing 320 is measured, is improved.

Figure 6:
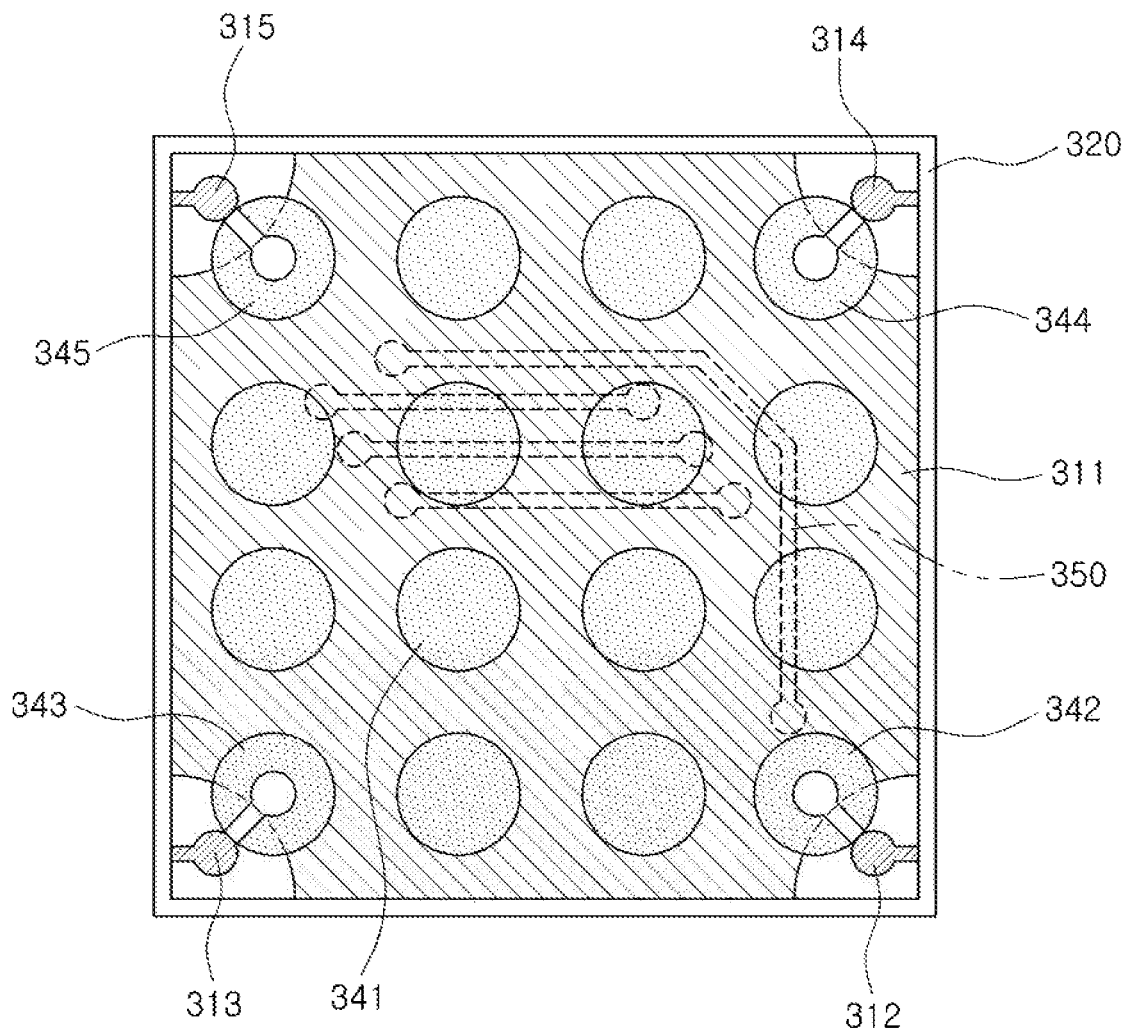
FIG. 6 is a view illustrating a bottom surface of a shielded electronic device module, according to an embodiment.

FIG. 6 is a view illustrating a bottom surface of a shielded electronic device module, according to an embodiment.

With reference to FIG. 6, the shielded electronic device module includes a first conductive member 311, a second conductive member 312, a third conductive member 313, a fourth conductive member 314, and a fifth conductive member 315, a metal housing 320, a first terminal 341, a second terminal 342, a third terminal 343, a fourth terminal 344, and a fifth terminal 345, and a conductive pattern 350. Additional terminals, which are not connected to the metal housing 320, may be provided as shown in FIG. 6.

The first terminal 341 may be provided in the form of a plurality of pads.

The conductive pattern 350 enables an electronic device, such as the electronic device 230 shown in FIGS. 2-4, to be electrically connected to a terminal disposed in a layer different from a layer in which the first conductive member 311 is positioned. Furthermore, the second terminal 342, the third terminal 343, the fourth terminal 344, and the fifth terminal 345 are respectively electrically connected to the second conductive member 312, the third conductive member 313, the fourth conductive member 314, and the fifth conductive member 315 by the conductive pattern 350 disposed in the layer different from the layer in which the first conductive member 311 is disposed. In addition, the conductive pattern 350 includes a plurality of vias which pass through the first conductive member 311 to be independently connected to each of a plurality of pads.

Figure 7:
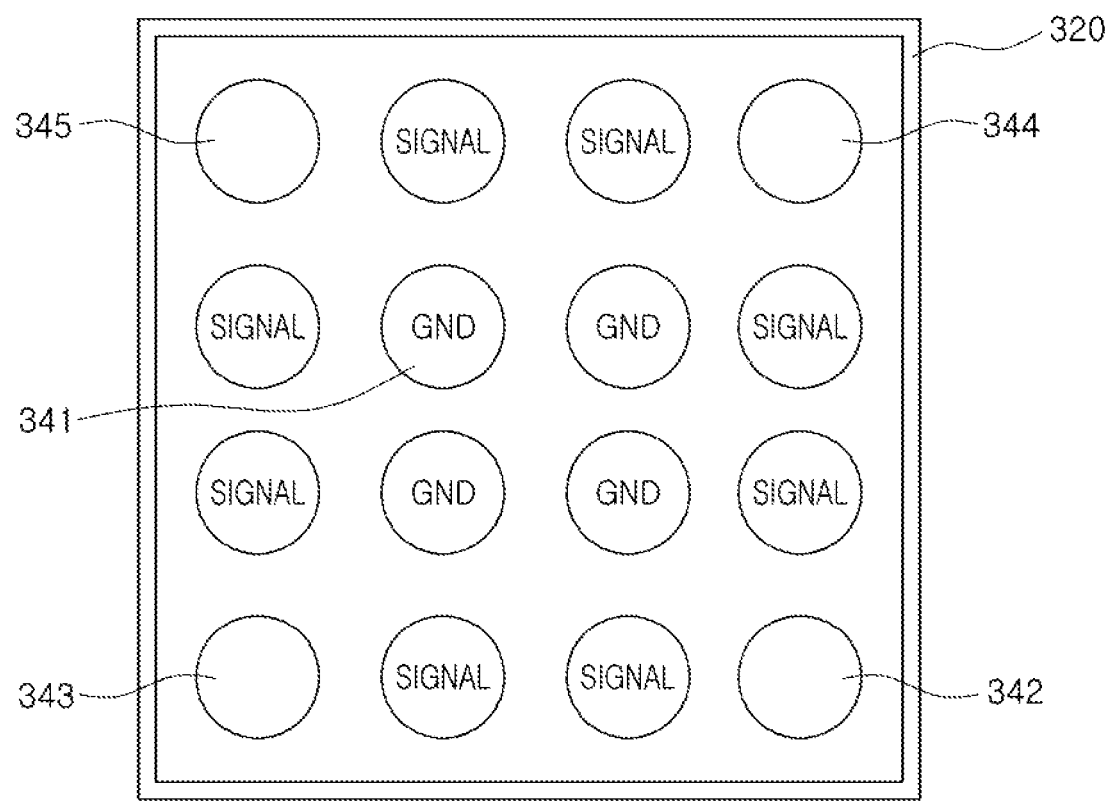
FIG. 7 is a view illustrating a plurality of terminals included in a shielded electronic device module, according to an embodiment.

FIG. 7 is a view illustrating a plurality of terminals included in a shielded electronic device module, according to an embodiment.

With reference to FIG. 7, a portion of pads included in the first terminal 341 may be a ground pad GND providing a ground voltage for an electronic device, another portion of the pads may be a signal pads SIGNAL providing signal paths for the electronic device. The second terminal 342, the third terminal 343, the fourth terminal 344, and the fifth terminal 345 provide measurement paths for conductivity measurement of the metal housing 320.

In one embodiment, the second terminal 342, the third terminal 343, the fourth terminal 344, and the fifth terminal 345 provide a signal path or provide a power supply path for the electronic device after conductivity of a metal housing 320 is measured.

Figure 8:
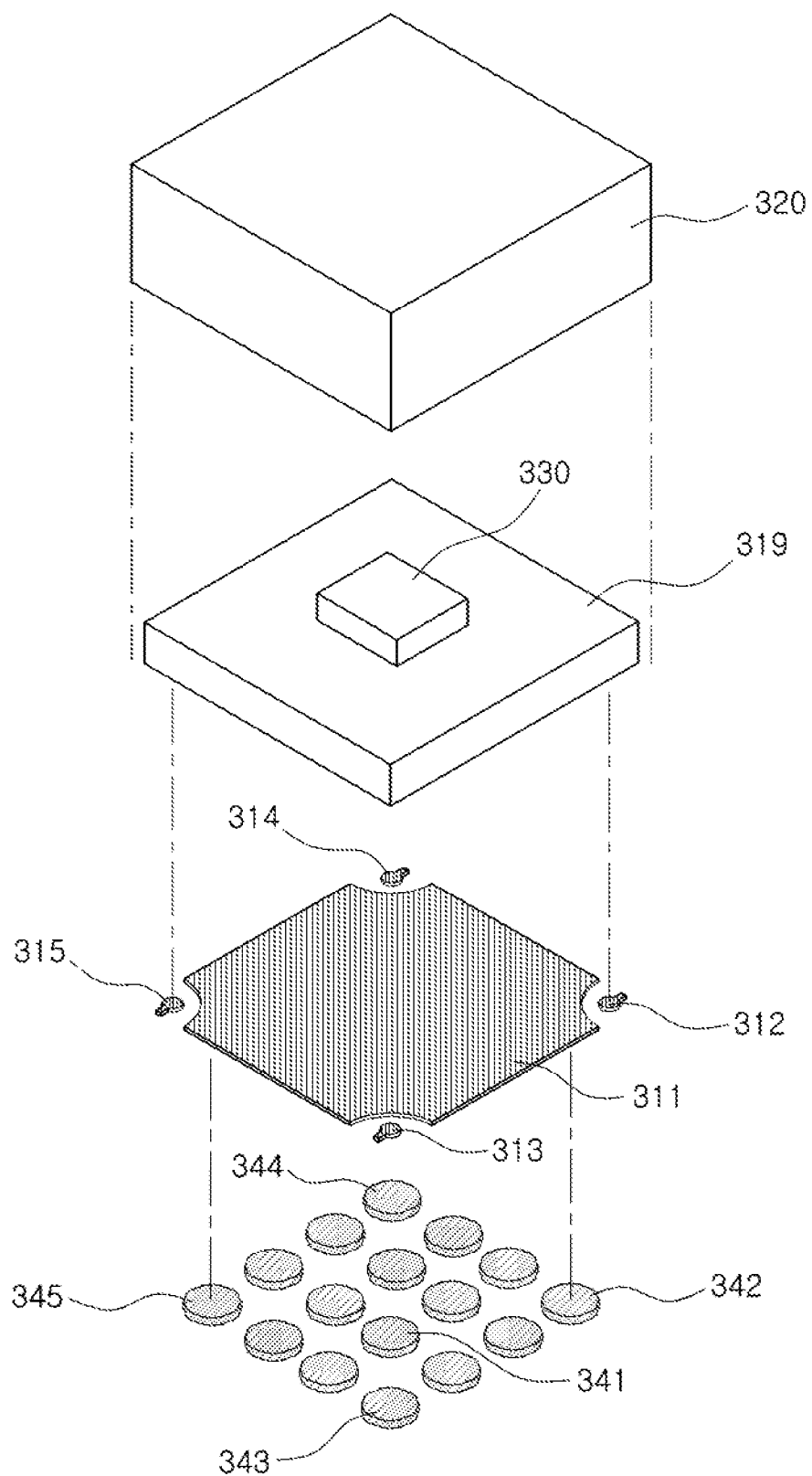
FIG. 8 is a perspective view illustrating a shielded electronic device module, according to an embodiment.

FIG. 8 is a perspective view illustrating a shielded electronic device module according to an embodiment.

With reference to FIG. 8, the first terminal 341, the second terminal 342, the third terminal 343, the fourth terminal 344, and the fifth terminal 345 are disposed on a lowest surface of an electronic device module. An example of the signals provided to a planar view of the lowest surface of the shielded electronic device module was seen in FIG. 7.

The first conductive member 311, the second conductive member 312, the third conductive member 313, the fourth conductive member 314, and the fifth conductive member 315, forming a second layer, are disposed on the first terminal 341, the second terminal 342, the third terminal 343, the fourth terminal 344, and the fifth terminal 345. An example of a planar view of the conductive members was seen in FIG. 5.

An insulating member 319, forming a third layer, is disposed on the first conductive member 311, the second conductive member 312, the third conductive member 313, the fourth conductive member 314, and the fifth conductive member 315. Examples of the insulating member of the third layer was seen in the insulators 119 and 219 of FIGS. 2-4.

An electronic device 330 is disposed on the insulating member 319. A metal housing 320 encases the electronic device 330. The metal housing 320 may further encase the third and second layers. Examples of the electronic device 330 and the metal housing 320 are seen in the device 230 and metal housing 220 in FIGS. 2-4.

In alternative embodiments, the insulating member 319 is additionally disposed on bottom surfaces of the first conductive member 311, the second conductive member 312, the third conductive member 313, the fourth conductive member 314, and the fifth conductive member 315. In addition, a gap between the electronic device 330 and the metal housing 320 is filled with a material such as epoxy, phenol resin, glass, or the like. Thus, durability of the electronic device module may be improved.

It will be appreciated that FIGS. 2-4, although only shown and described with the first terminal 241, the second terminal 242, the third terminal 243, the first conductive member 211, the second conductive member 212, and the third conductive member 213, additional terminals and conductive members are contemplated by FIGS. 2-4. For example, fourth and fifth terminals and conductive members, similar to those shown in FIGS. 5-8 may be provided. The fourth terminal, the fifth terminal, the fourth conductive member, and the fifth conductive member may be, for example, obscured behind the second and third terminals and conductive members of FIGS. 2-4.

While a particular configuration of terminals 341-345 and conductive members 311-315 has been described, as will be apparent after an understanding of the disclosure of this application, the terminals and conductive members may be in a different order or location. Additionally, more or fewer terminals and conductive members may be used without departing from the spirit of this disclosure.

For example, the terminals 341-345 may be located on a bottom surface of a shielded electronic device module, as shown in FIG. 6, or the terminals 341-345 may be located on the bottom surface in another area that is not covered by the metal housing 320. The terminals may also be located on a top surface of the electronic device module in another area that is not covered by the metal housing 320. Thus, the insulating member 319, or substrate 210 of FIG. 2 may be lengthened, stacked, or bent and the terminals 341-345 may be located on any surface thereof.

Figure 9:
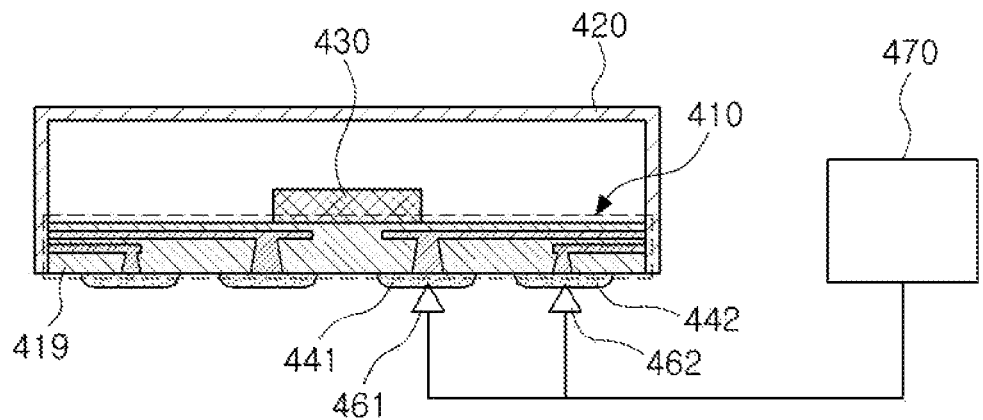
FIG. 9 is a view illustrating a method to measure shielding of a shielded electronic device module according to an embodiment.

FIG. 9 is a view illustrating a method to measure shielding of a shielded electronic device module, according to an embodiment.

With reference to FIG. 9, a shielded electronic device module includes a substrate 410, a metal housing 420, an electronic device 430, and a first pad 441 and a second pad 442. An insulator 419 is disposed within the substrate to electrically isolate the first pad 441 and the second pad 442.

Each of the first pad 441 and the second pad 442 is in contact with each of the first measuring terminal 461 and the second measuring terminal 462, respectively. The first measuring terminal 461 and the second measuring terminal 462 are electrically connected to a multimeter 470.

The multimeter 470 applies voltages having levels different from each other to the first measuring terminal 461 and the second measuring terminal 462 to measure a current flowing through the first measuring terminal 461 and the second measuring terminal 462. The voltage difference between measuring terminal 461 and measuring terminal 462 and the current flowing through the measuring terminal 461 and 462 may then be used to calculate the conductivity or resistance of the metal housing 420.

Thus, the conductivity and, therefore, a shielding performance of the shielded electronic device module is measured through the first pad 441 and the second pad 442 disposed on a bottom surface of the shielded electronic device module. Since the first pad 441 and the second pad 442 are disposed on a same surface of the shielded electronic device module, a measurement environment of the exemplary electronic device module is simplified.

For example, inverted shielded electronic device modules may be measured as a batch by the first measuring terminal 461 and the second measuring terminal 462 controlled by a predetermined algorithm. Thus, the method of measuring shielding of the shielded electronic device module improves measurement efficiency with respect to the batch of electronic device modules.

For example, providing the first pad 441 and the second pad 442 allows the multimeter 470 to measure the shielding of the exemplary electronic device module without directly contacting the metal housing 420, which avoids damaging the exemplary electronic device module and reduces the error of the measurement. Furthermore, other elements of the exemplary electronic device module may be simultaneously measured or validated while measuring the shielding of the electronic device module due to the common terminal interface. The terminals may be provided in the physical form of a pad or a pin, for example.

Figure 10:
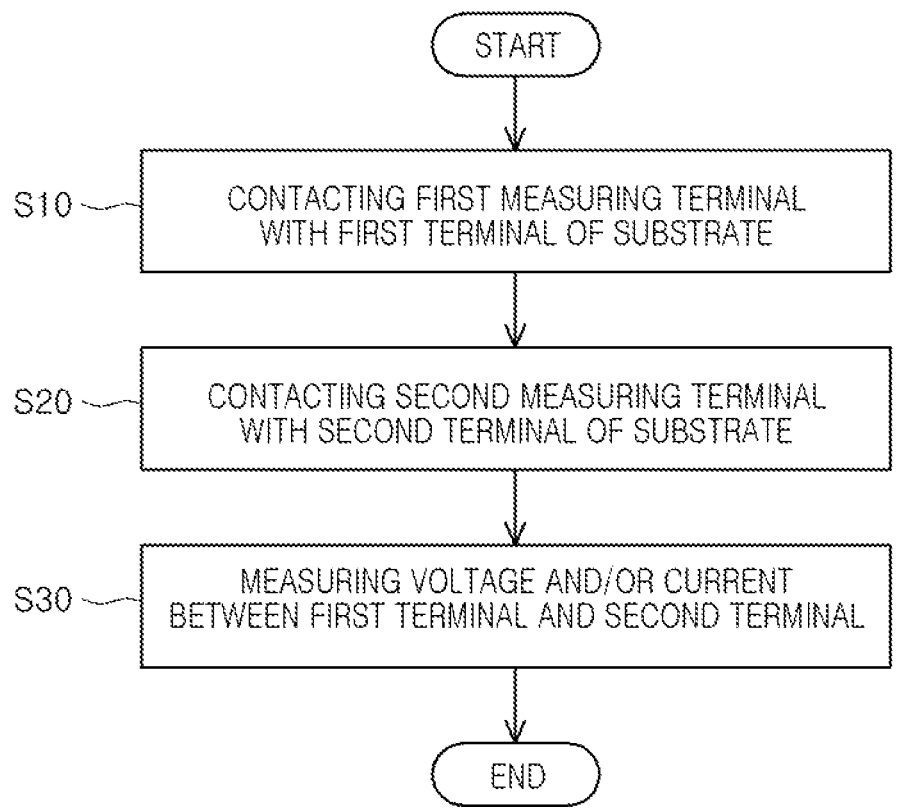
FIG. 10 is a flowchart illustrating a method to measure shielding of a shielded electronic device module, according to an embodiment.

FIG. 10 is a flowchart illustrating a method to measure shielding of a shielded electronic device module, according to an embodiment.

With reference to FIG. 10, a method of measuring shielding of a shielded electronic device module includes contacting a first measuring terminal with a region on a second surface of a substrate in which a first surface is shielded, contacting a second measuring terminal with an another region on the second surface, and measuring of a voltage and/or a current between the first measuring terminal and the second measuring terminal.

In an embodiment, the first terminal and the second terminal may be disposed on a same surface of the substrate, and may be separated from each other.

As set forth above, according to embodiments in the present disclosure, an electronic device module may provide a shielding measurement environment to prevent damage to a metal housing and improving measurement accuracy.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A shielded electronic device module comprising:
   a substrate comprising a first conductive member, a second conductive member, a third conductive member, a fourth conductive member, and a fifth conductive member separated from one other;
   a metal housing covering a mounting space on a first surface of the substrate, and connected to the first to fifth conductive members; and
   a first terminal, a second terminal, a third terminal, a fourth terminal, and a fifth terminal isolated from one another, disposed on a second surface of the substrate, and respectively connected to the first to fifth conductive members,
   wherein the second to fifth conductive members are symmetrically disposed with respect to the first conductive member.

2. The shielded electronic device module of claim 1, wherein
   the first to fifth conductive members are exposed on surfaces of the substrate other than the first substrate and the second substrate, and
   the metal housing is connected to the first to fifth conductive members where the first to fifth conductive members are exposed on the other surfaces of the substrate.

3. The shielded electronic device module of claim 1, further comprising an electronic device disposed on the mounting space on the substrate, wherein the first conductive member provides a ground voltage for the electronic device.

4. The shielded electronic device module of claim 3, further comprising additional terminals disposed on the second surface of the substrate,
   wherein some of the additional terminals provide a ground voltage for the electronic device, and other ones of the additional terminals provide signal paths for the electronic device.

5. The shielded electronic device module of claim 1, wherein the substrate further comprises an insulating member disposed between the first to fifth conductive members.

6. The shielded electronic device module of claim 5, wherein
   the substrate comprises layers stacked on one other,
   the first to fifth conductive members are disposed in one of the layers, and
   the insulating member surrounds the first to fifth conductive members.

7. The shielded electronic device module of claim 1, wherein the second to fifth conductive members are disposed closer to corners of the metal housing than to the first conductive member.

8. The shielded electronic device module of claim 1, wherein the second to fifth conductive members have a same form that is different from a form of the first conductive member.

9. The shielded electronic device module of claim 1, wherein the second to fifth conductive members are smaller than the first conductive member.

10. The shielded electronic device module of claim 1, wherein the respective connections between the second to fifth conductive members and the metal housing have a small area to increase respective resistances between the second to fifth conductive members and the metal housing.

11. The shielded electronic device module of claim 1, wherein the second surface of the substrate is an external surface of the shielded electronic device module.

12. A method of measuring shielding of a shielded electronic device module, the method comprising:
   contacting a first measuring terminal with a first region on a second surface of a substrate, the substrate having a first surface that is shielded;
   contacting a second measuring terminal with a second region on the second surface of the substrate other than the first region;
   causing a first current to flow between the first measuring terminal contacted by the first region and the second measuring terminal contacted by the second region; measuring the first current;
   contacting the first measuring terminal with the first region or the second region;
   contacting the second measuring terminal with a third region on the second surface of the substrate other than the first region and the second region;
   causing a second current to flow between the first measuring terminal contacted by the first region or the second region and the second measuring terminal contacted by the third region;
   measuring the second current; and
   comparing the first current and the second current with each other,
   wherein the second surface includes a center region and an edge region, the first region is positioned in the center region, and the second and third regions are positioned in the edge region.

13. The method of claim 12, wherein
   the contacting of the first measuring terminal with the first region comprises contacting the first measuring terminal with a first pad disposed on the second surface of the substrate in the first region,
   the contacting of the second measuring terminal with the second region comprises contacting the second measuring terminal with a second pad disposed on the second surface of the substrate in the second region,
   the contacting of the first measuring terminal with the first region or the second region comprises contacting the first measuring terminal with the first pad or the second pad;
   the contacting of the second measuring terminal with the third region comprises contacting the second measuring terminal with a third pad disposed on the second surface of the substrate in the third region; and
   the first pad, the second pad, and the third pad are separated from one other.

14. A shielded electronic device module comprising:
   a substrate comprising a mounting surface shielded by a metal housing;
   a first planar conductor disposed within the substrate, spaced apart from the mounting surface of the substrate, configured to shield the mounting surface of the substrate, and connected to at least two sides of the metal housing;

a second conductor disposed within the substrate, spaced apart from the mounting surface of the substrate, and connected to a first portion of the metal housing; and a third conductor disposed within the substrate, spaced apart from the mounting surface of the substrate, and connected to a second portion of the metal housing, wherein the first planar conductor, the second conductor, and the third conductor are respectively connected to a first terminal, a second terminal, and a third terminal isolated from one another and disposed on an external surface of the shielded electronic device module.

15. The shielded electronic device module of claim 14, wherein the first terminal is a ground terminal of the shielded electronic device module.

16. The shielded electronic device module of claim 14, further comprising a fourth conductor disposed within the substrate and configured to provide a signal path between the mounting surface of the substrate and a signal terminal isolated from the first through third terminals and disposed on the external surface of the shielded electronic device module.

17. The shielded electronic device module of claim 16, wherein the fourth conductor passes through a hole in the first planar conductor without touching the first planar conductor.

18. The shielded electronic device module of claim 14, wherein an area of a surface of the first planar conductor facing the mounting surface of the substrate is substantially equal to an area of the mounting surface of the substrate.

19. A shielded electronic device comprising:
a substrate comprising a mounting surface shielded by a metal housing;
a first planar conductor disposed within the substrate, configured to shield the mounting surface of the substrate, and connected to the metal housing;
a second conductor connected to a portion of the metal housing; and
a third conductor connected to a different portion of the metal housing,
wherein the first conductor, the second conductor, and the third conductor are connected to isolated terminals on an external surface of the shielded electronic device module,
the first planar conductor is connected to at least two sides of the metal housing, and
the first planar conductor comprises:
a first cutout in which the second conductor is disposed without contacting the first planar conductor; and
a second cutout in which the third conductor is disposed without contacting the first planar conductor.

20. A shielded electronic device comprising:
a substrate comprising a mounting surface shielded by a metal housing;
a first planar conductor disposed within the substrate, configured to shield the mounting surface of the substrate, and connected to the metal housing;
a second conductor connected to a portion of the metal housing; and
a third conductor connected to a different portion of the metal housing,
wherein the first conductor, the second conductor, and the third conductor are connected to isolated terminals on an external surface of the shielded electronic device module,
the first planar conductor is connected to at least two sides of the metal housing, and
the first planar conductor is connected to substantially an entire perimeter of the metal housing, but is not connected to the portion of the metal housing to which the second conductor is connected, and is not connected to the other portion of the metal housing to which the third conductor is connected.

21. A shielded electronic device module comprising:
a substrate having a first surface, a second surface parallel to the first surface, a third surface connecting the first surface to the second surface, and a fourth surface connecting the first surface to the second surface;
a first conductive member embedded in the substrate and comprising:
a first planar member spaced apart from the first surface of the substrate and the second surface of the substrate, and exposed on the third surface of the substrate but not exposed on the fourth surface of the substrate; and
a first connection member connecting the first planar member to the second surface of the substrate;
a second conductive member embedded in the substrate and comprising:
a second planar member spaced apart from the first planar member, the first surface of the substrate, and the second surface of the substrate, and either:
exposed on the third surface of the substrate but not exposed on the fourth surface of the substrate, or
exposed on the fourth surface of the substrate but not exposed on the third surface of the substrate; and
a second connection member connecting the second planar member to the second surface of the substrate; and
a metal housing covering a mounting area on the first surface of the substrate, the metal housing being connected to the exposed first conductive member on the third surface of the substrate, and connected to the exposed second conductive member on either the third surface of the substrate or the fourth surface of the substrate,
wherein the first connection member and the second connection member are spaced apart from the metal housing, and
wherein the first conductive member and the second conductive member are spaced apart in the substrate.

22. The shielded electronic device module of claim 21, wherein
the substrate comprises a plurality of layers, and
the first planar member and the second planar member are disposed in a same layer among the layers of the substrate.

23. The shielded electronic device module of claim 21, wherein
the substrate comprises a plurality of layers, and
the first planar member and the second planar member are disposed in different layers among the layers of the substrate.

* * * * *